United States Patent
Yamazaki et al.

(10) Patent No.: US 8,482,956 B2
(45) Date of Patent: Jul. 9, 2013

(54) SEMICONDUCTOR MEMORY DEVICE AND METHOD OF DRIVING THE SAME

(75) Inventors: Shinobu Yamazaki, Osaka (JP); Yoshiji Ohta, Osaka (JP); Kazuya Ishihara, Osaka (JP); Mitsuru Nakura, Osaka (JP); Suguru Kawabata, Osaka (JP); Nobuyoshi Awaya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 13/179,839

(22) Filed: Jul. 11, 2011

(65) Prior Publication Data

US 2012/0014163 A1    Jan. 19, 2012

(30) Foreign Application Priority Data

Jul. 16, 2010  (JP) ................................. 2010-162072
Mar. 31, 2011  (JP) ................................. 2011-078419

(51) Int. Cl.
G11C 11/21    (2006.01)

(52) U.S. Cl.
USPC ...... 365/148; 365/158; 365/226; 365/185.02; 365/185.2; 365/189.16

(58) Field of Classification Search
USPC ................. 365/148, 158, 226, 185.02, 185.2, 365/189.16
See application file for complete search history.

(56) References Cited

U.S. PATENT DOCUMENTS

| | | | |
|---|---|---|---|
| 6,608,776 B2 | 8/2003 | Hidaka | |
| 7,580,278 B2* | 8/2009 | Cho et al. | 365/163 |
| 7,920,405 B2* | 4/2011 | Kang et al. | 365/148 |
| 8,199,603 B2* | 6/2012 | Chung et al. | 365/230.06 |
| 2005/0122768 A1 | 6/2005 | Fukumoto | |
| 2009/0135637 A1 | 5/2009 | Takase | |
| 2010/0142245 A1 | 6/2010 | Kitagawa | |
| 2010/0296330 A1 | 11/2010 | Kotaki et al. | |

FOREIGN PATENT DOCUMENTS

| | | |
|---|---|---|
| JP | 2002-151665 | 5/2002 |
| JP | 2005-092912 | 4/2005 |
| JP | 2009-093724 | 4/2009 |
| JP | 2010-140526 | 6/2010 |
| JP | 2010-272147 | 12/2010 |

* cited by examiner

*Primary Examiner* — Richard Elms
*Assistant Examiner* — Hai Pham
(74) *Attorney, Agent, or Firm* — Nixon & Vanderhye, P.C.

(57) ABSTRACT

A semiconductor memory device includes a memory cell array where a plurality of memory cells are arranged in a matrix, each of the memory cells serially connecting a two-terminal type memory element and a transistor for selection, a first voltage applying circuit that applies a write voltage pulse to a bit line, and a second voltage applying circuit that applies a precharge voltage to a bit line and a common line. In writing the memory cell, after the second voltage applying circuit has both terminals of the memory cell previously precharged to the same voltage, the first voltage applying circuit applies the write voltage pulse to one terminal of the writing target memory cell via the bit line, and while the write voltage pulse is applied, the second voltage applying circuit maintains the application of the precharge voltage to the other terminal of the memory cell via the common line.

26 Claims, 10 Drawing Sheets

SEMICONDUCTOR MEMORY DEVICE AND METHOD OF DRIVING THE SAME

CROSS REFERENCE TO RELATED APPLICATION

This Nonprovisional application claims priority under 35 U.S.C. §119(a) on Patent Applications No. 2010-162072 filed in Japan on Jul. 16, 2010 and No. 2011-078419 filed in Japan on Mar. 31, 2011 the entire contents of which are hereby incorporated by reference.

BACKGROUND OF THE INVENTION

1. Field of the Invention

The present invention relates to a semiconductor memory device and a method of driving the same, and more specifically, relates to a semiconductor memory device that performs writing of information stored as resistance states of variable resistance elements of memory cells by application of a voltage pulse and a method of driving the same.

2. Description of the Related Art

In recent years, a new type of non-volatile semiconductor memory device to take place of a flash memory is being widely developed. Among those, a RRAM using a phenomenon of an occurrence of a change in a resistance due to application of a voltage to a variable resistance film such as a transition metal oxide or the like is commonly subjected to research and development since it is advantageous in regards to a limit in miniaturization compared to the flash memory, and is capable of a high-speed data writing.

As a configuration of a memory cell array using the RRAM, there has been conventionally used, as described in Japanese Unexamined Patent Publication No. 2002-151661, a 1T1R type memory cell array capable of restricting a leak current and a sneak current flowing in unselected memory cells upon performing the writing and reading of information stored in variable resistance elements of selected memory cells by serially connecting transistors for cell selection to variable resistance elements of memory cells.

FIG. 8 shows a cell array configuration of the conventionally-used RRAM. In a memory cell array 200, R11 to Rn1, R12 to Rn2, . . . , R1m to Rnm as variable resistance elements and Q11 to Qn1, Q12 to Qn2, . . . , Q1m to Qnm as transistors for cell selection are arranged respectively in a row direction (a lateral direction in the figure) and a column direction (a vertical direction in the figure) in a matrix. In each of the memory cells, one terminal of the variable resistance element and one terminal of the transistor are connected, and the other terminals of the variable resistance elements of the memory cells arranged in the same row are respectively connected to bit lines BL1 to BLm extending in the row direction; the other terminals of the transistors of the memory cells arranged in the same column are connected to a common line CML that is common for all of the memory cells; and word lines WL1 to WLn extending in the column direction are respectively connected to gate terminals of the transistors of the memory cells arranged in the same column.

Write voltages are supplied through Power lines V1 and V2 from outside, and the voltage from the power line V1 is applied to the bit lines BL1 to BLm, and the voltage from the power line V2 is applied to the common line CML respectively via transistors in a write voltage applying circuit 201. Further, the bit lines BL1 to BLm and the common line CML are short-circuited via transistors in an initialization circuit 202, and by applying the voltage to the bit lines from a common line side, a bit line voltage that is in a former writing operation voltage state due to an influence of a parasitic capacity of wirings between the bit line and the variable resistance elements connected to the bit line can be initialized.

FIG. 9 shows a timing chart upon writing a variable resistance element R11 of FIG. 8. Hereinafter, an operation to lower a resistance state of a variable resistance element to a low resistance and increase a current flowing in a memory cell is referred to as "set (program)", and an operation to increase the resistance state of the variable resistance element to a high resistance and decrease the current flowing in the memory cell is referred to as "reset (erase)". Definitions of set and reset may of course be opposite of the above. Further, such set and reset in combination is referred to as "write".

At time t1, the word line WL1 is raised to a voltage $V_{WLS}$ (representative value: 4 V) upon setting or to a voltage $V_{WLR}$ (representative value: 6 V) upon resetting, and then, φ0, φ11, φ22 to φ2m are raised at time t2 to perform an initialization operation. That is, the voltage of the power line V1 is applied to a selected bit line BL1 via a transistor of the write voltage applying circuit 201, the voltage of the power line V2 is applied to the common line CML, and further, a voltage identical to that of the common line CML is applied to unselected bit lines BL2 to BLm via a transistor of the initialization circuit 202, to initialize the voltage of the unselected bit lines. At this time, the voltage of the power lines V1 and V2 is the same initialization voltage $V_{PRE}$ (representative value: 1.5 V), and as a result, the common line CML and all of the bit lines BL1 to BLm are precharged to the same voltage $V_{PRE}$.

Thereafter, during time t4 to t5, a write voltage pulse is applied to the power lines V1 and V2. That is, upon the setting, the power line V1 is changed to a voltage $V_{SET}$ (representative value: 3 V) and the power line V2 is changed to GND, and current is made to flow toward the common line CML from the selected bit line BL1 via R11, Q11. On the other hand, upon the resetting, the power line V1 is changed to GND and the power line V2 is changed to a voltage $V_{RST}$ (representative value: 3 V), and the current is made to flow toward the selected bit line BL1 from the common line CML via Q11, R11.

In the array configuration shown in FIG. 8, although the resistance values of the variable resistance elements can be changed, a problem occurs in operations with voltage pulses having short time width, that is, a high-speed operation is impossible. A reason therefor will be described below.

In order for the variable resistance elements to cause changes in their resistance, a voltage larger than a certain value must be applied for over a certain period of time. An interval Δt between time t4 and t5 must be set so as to satisfy such a condition.

FIG. 10 schematically shows a voltage change of a voltage pulse applied to one terminal of a variable resistance element in a case where a voltage pulse of Δt=8 ns is applied to the common line. A speed of the voltage change varies depending on magnitudes of a parasitic resistance and a parasitic capacity of wirings to be driven. In FIG. 10, (a) and (b) show the waveforms of the voltage pulses applied to one terminal of the variable resistance element in a case of the parasitic resistance and the parasitic capacity of the common line respectively being 50Ω and 10 pF, and a time constant RC determined by the parasitic resistance and the parasitic capacity being 0.5 ns. In FIG. 10, (c) and (d) show the waveforms of the voltage pulses applied to one terminal of the variable resistance element in a case of the parasitic resistance and the parasitic capacity of the common line respectively being 250Ω and 50 pF, and the time constant RC determined by the parasitic resistance and the parasitic capacity being 12.5 ns. Particularly, at the moment of time t4, since the transistors for precharging connected to the unselected bit lines of ϕ22 to ϕ2m are open, the parasitic resistance and the parasitic capacity belonging to the driven wirings are very large (representative value of the parasitic resistance: 300Ω, representative value of the parasitic capacity: 100 pF) since the parasitic resistance and the parasitic capacity of the unselected bit lines are added in addition to the parasitic resistance and the parasitic capacity of the common line itself.

Therefore, the voltage change in the voltage pulse applied to one terminal of the variable resistance element do not exhibit a high-speed change as shown in (a) and (b) of FIG. 10, and rather is extremely slow as shown in (c) and (d) of FIG. 10. In the ease where the time interval Δt is short and insufficient, there may be a case in which the resistance change in the variable resistance element does not occur for not having reached $V_{RST}$ or $V_{SET}$. In order to avoid such a problem, Δt must be made sufficiently long.

SUMMARY OF THE INVENTION

An object of the present invention is to solve the problem that application of the short-period voltage pulse to the memory elements is difficult due to the parasitic resistance on the common line side and to provide a semiconductor memory device capable of a high-speed operation.

In order to achieve the above object, a semiconductor memory device according to the present invention has a first feature of including: a memory cell array formed of a plurality of memory cells being arranged in column and row directions in a matrix, each of the plurality of memory cells having two input/output terminals and including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor; word lines extending in the column direction and respectively connecting the control terminals of the cell transistors of the memory cells arranged in the same column; bit lines extending in the row direction and connecting one terminals of the input/output terminals of the memory cells arranged in the same row; a common line extending in the column or the row direction, and connecting other terminals of the input/output terminals of the memory cells; a word line voltage applying circuit that applies a voltage to a word line connected to the memory cell selected as a writing target in the writing of the information stored in the memory element; a first voltage applying circuit that applies a write voltage to the bit line connected to the selected memory cell; and a second voltage previously applying circuit that applies an identical precharge voltage to both of the bit line and the common line connected to the selected memory cell prior to applying the write voltage, and that applies the precharge voltage to the common line connected to the selected memory cell while the write voltage is applied to the bit line connected to the selected memory cell.

Further, in addition to the first feature, the semiconductor memory device according to the present invention has a second feature that the second voltage applying circuit includes a precharge power line to which the precharge voltage is applied, and the precharge power line is directly connected to the common line, and is connected to the respective bit lines via first transistors that are provided for each of the bit lines.

Further, in addition to any of the above features, the semiconductor memory device according to the present invention has a third feature that the first voltage applying circuit includes a write power line to which the write voltage is applied, and the write power line is connected to the respective bit lines via second transistors that are provided for each of the bit lines.

Further, in addition to any of the above features, the semiconductor memory device according to the present invention has a fourth feature that the first voltage applying circuit includes a first write power line and a second write power line to which the write voltage having a different application voltage from the precharge voltage is respectively applied.

Further, in addition to any of the first to fourth features, the semiconductor memory device according to the present invention has a fifth feature that in the writing of the information stored in the memory element, a first writing operation of writing the electrical property of the memory element from a first state to a second state, and a second writing operation of writing the electrical property of the memory element from the second state to the first state are included, and the precharge voltage applied by the second voltage applying circuit in the first writing operation is identical to that in the second writing operation.

Further, in addition to any of the first to fourth features, the semiconductor memory device according to the present invention has a sixth feature that in the writing of the information stored in the memory element, a first writing operation of writing the electrical property of the memory element from a first state to a second state, and a second writing operation of writing the electrical property of the memory element from the second state to the first state are included, and the precharge voltage applied by the second voltage applying circuit in the first writing operation is different from that in the second writing operation.

According to the semiconductor device of any of the first to sixth features, the voltage pulse for writing is applied by the first voltage applying circuit from a bit line side upon the writing operation of the selected memory cell. At this time, a constant precharge voltage is previously applied to the common line connected with the memory element of the selected memory cell, and the high-speed operation becomes possible since the application of the precharge voltage is maintained throughout the writing operation.

Further, in addition to any of the first to fourth features, the semiconductor memory device according to the present invention has a seventh feature that in the writing of the information stored in the memory element, a first writing operation of writing the electrical property of the memory element from a first state to a second state having a lower resistance than the first state, and a second writing operation of writing the electrical property of the memory element from the second state to the first state are included, a polarity of the write voltage with respect to the precharge voltage in the first writing operation is different from that in the second writing operation, and a voltage difference between a word line voltage applied to the word line connected to the selected memory cell and a lower one of the precharge voltage and the write voltage in the first writing operation is smaller than a voltage difference between the word line voltage and a lower one of the precharge voltage and the write voltage in the second writing operation.

According to the semiconductor memory device of the seventh feature, stable programming can be performed by making the voltage difference (absolute value) between a gate and a source of the transistor upon the operation to lower the resistance smaller than the voltage difference (absolute value)

between the gate and the source of the transistor upon the operation to increase the resistance.

Further, in addition to the seventh feature, the semiconductor memory device according to the present invention has an eighth feature that the word line voltage applied by the word line voltage applying circuit in the first writing operation is identical to that in the second writing operation.

Further, in addition to the eighth feature, the semiconductor memory device of the present invention has a ninth feature that in the writing of the information stored in the plurality of memory elements, a plurality of the memory cells connected to the selected word line are selected, and the first writing operation or the second writing operation is performed consecutively on the plurality of memory cells.

Further, in addition to any of the seventh to ninth features, the semiconductor memory device according to the present invention has a tenth feature that the precharge voltage applied by the second voltage applying circuit in the first writing operation is identical to that in the second writing operation.

Further, in addition to any of the above features, the semiconductor memory device according to the present invention has an eleventh feature that the memory element is a bipolar variable resistance element in which a resistance state expressed by a resistance property between the two input/output terminals of the memory element reversibly transitions by applying voltages having different polarities.

The memory element used in the semiconductor memory device of the present invention can be applied to a memory element that stores information by a difference in the electrical property and performs writing of the stored information by application of a voltage such as a magnetic tunnel junction element used in an MRAM, a phase change memory (PCRAM), an OUM (Ovonic Unified Memory), or a variable resistance element used in a RRAM, or the like; and preferably, it is useful for the variable resistance element used in the RRAM, and is especially useful for a bipolar variable resistance element. Since the bipolar variable resistance element performs writing by changing the electric resistance by the application of voltages having different polarities, a semiconductor memory device capable of a high-speed operation can be realized by using the configuration of the semiconductor memory device of the present invention.

In order to achieve the above object, a method of driving a semiconductor memory device according to the present invention has a first feature of being a method of driving a semiconductor memory device that includes: a memory cell array formed of a plurality of memory cells being arranged in column and row directions in a matrix, each of the plurality of memory cells having two input/output terminals, and including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor; word lines extending in the column direction and respectively connecting the control terminals of the cell transistors of the memory cells arranged in the same column; bit lines extending in the row direction and connecting one terminals of the input/output terminals of the memory cells arranged in the same row; and a common line extending in the column or the row direction and connecting the other terminals of the input/output terminals of the memory cells, the method including, in the writing of the information stored in the memory element: a word line voltage applying step of selecting the memory cell that is a writing target and applying a word line voltage to the word line connected to the selected memory cell; a precharging step of previously applying an identical precharge voltage to both of the bit line and the common line connected to the selected memory cell prior to application of a write voltage; and a writing step of applying the write voltage to the bit line connected to the selected memory cell and maintaining the application of the precharge voltage to the common line connected to the selected memory cell during the application of the write voltage.

Further, in addition to the first feature, the method of driving the semiconductor memory device according to the present invention has a second feature that the semiconductor memory device includes a first voltage applying circuit for applying the write voltage to the bit line connected to the selected memory cell and a second voltage applying circuit for applying the precharge voltage to the bit line and the common line connected to the selected memory cell, the second voltage applying circuit includes a precharge power line that is directly connected to the common line, and is connected to the respective bit lines via first transistors that are provided for each of the bit lines, in the precharging step, the precharge voltage is applied to both of the bit line and the common line via the precharge power line by making the first transistor connected to the bit line connected to the selected memory cell be in an ON state, and in the writing step, the precharge voltage is applied to the common line via the precharge power line by making the first transistor connected to the bit line connected to the selected memory cell be in an OFF state.

Further, in addition to any of the first and second features, the method of driving the semiconductor memory device according to the present invention has a third feature that the precharge voltage applied in the precharging step and the writing step in a case of writing the electrical property of the memory element from a first state to a second state is identical to that in a case of writing the electrical property of the memory element from the second state to the first state.

Further, in addition to any of the first and second features, the method of driving the semiconductor memory device according to the present invention has a fourth feature that the precharge voltage applied in the precharging step and the writing step in a case of writing the electrical property of the memory element from a first state to a second state is different from that in a case of writing the electrical property of the memory element from the second state to the first state.

Further, in addition to any of the first and second features, the method of driving the semiconductor memory device according to the present invention has a fifth feature that in the writing step, one of a resistance lowering step of writing the electrical property of the memory element from a first state to a second state having a lower resistance than the first state and a resistance increasing step of writing the electrical property of the memory element from the second state to the first state is performed to each of the memory cells selected as the writing target, a polarity of the write voltage with respect to the precharge voltage in the resistance lowering step is different from that in the resistance increasing step, and a voltage difference between the word line voltage and a lower one of the precharge voltage and the write voltage in the resistance lowering step is smaller than a voltage difference between the word line voltage and a lower one of the precharge voltage and the write voltage in the resistance increasing step.

Further, in addition to the fifth feature, the method of driving the semiconductor memory device according to the present invention has a sixth feature that the word line voltage applied in the word line voltage applying step in a case of performing the resistance lowering step is identical to that in a case of performing the resistance increasing step.

Further, in addition to the sixth feature, the method of driving the semiconductor memory device according to the present invention has a seventh feature that in the word line voltage applying step, a plurality of the memory cells connected to the selected word line are selected, and the method further including a step of performing the resistance lowering step or the resistance increasing step consecutively on the plurality of memory cells.

Further, in addition to any of the fifth to seventh features, the method of driving the semiconductor memory device according to the present invention has an eighth feature that the precharge voltage applied in the precharging step and the writing step in a case of performing the resistance lowering step is identical to that in a case of performing the resistance increasing step.

According to the method of driving the semiconductor memory device of any of the first to eighth features, the voltage pulse for writing is applied from the bit line side upon the writing operation of the selected memory cell. At this time, a constant precharge voltage is previously applied to the common line connected with the memory element of the selected memory cell, and since the application of the precharge voltage is maintained throughout the writing operation, the high-speed operation becomes possible.

Further, in addition to any of the above features, the method of driving the semiconductor memory device according to the present invention has a ninth feature that the memory element is a bipolar variable resistance element in which a resistance state expressed by a resistance property between the two input/output terminals of the memory element reversibly transitions by the application of voltages having different polarities.

As described above, the method of driving the semiconductor memory device of the present invention is useful for the variable resistance element used in the RRAM, and is particularly useful in the case of using the bipolar variable resistance element as the memory element, and a semiconductor memory device capable of a high-speed operation can be realized.

Therefore, according to the present invention, in a semiconductor memory device using a memory element that writes stored information by applying a voltage in a memory cell, writing of the stored information by applying a short voltage pulse becomes possible by utilizing the configuration of the present invention, and a semiconductor memory device capable of a high-speed operation can be provided.

DETAILED DESCRIPTION OF THE INVENTION

First Embodiment

Figure 1:
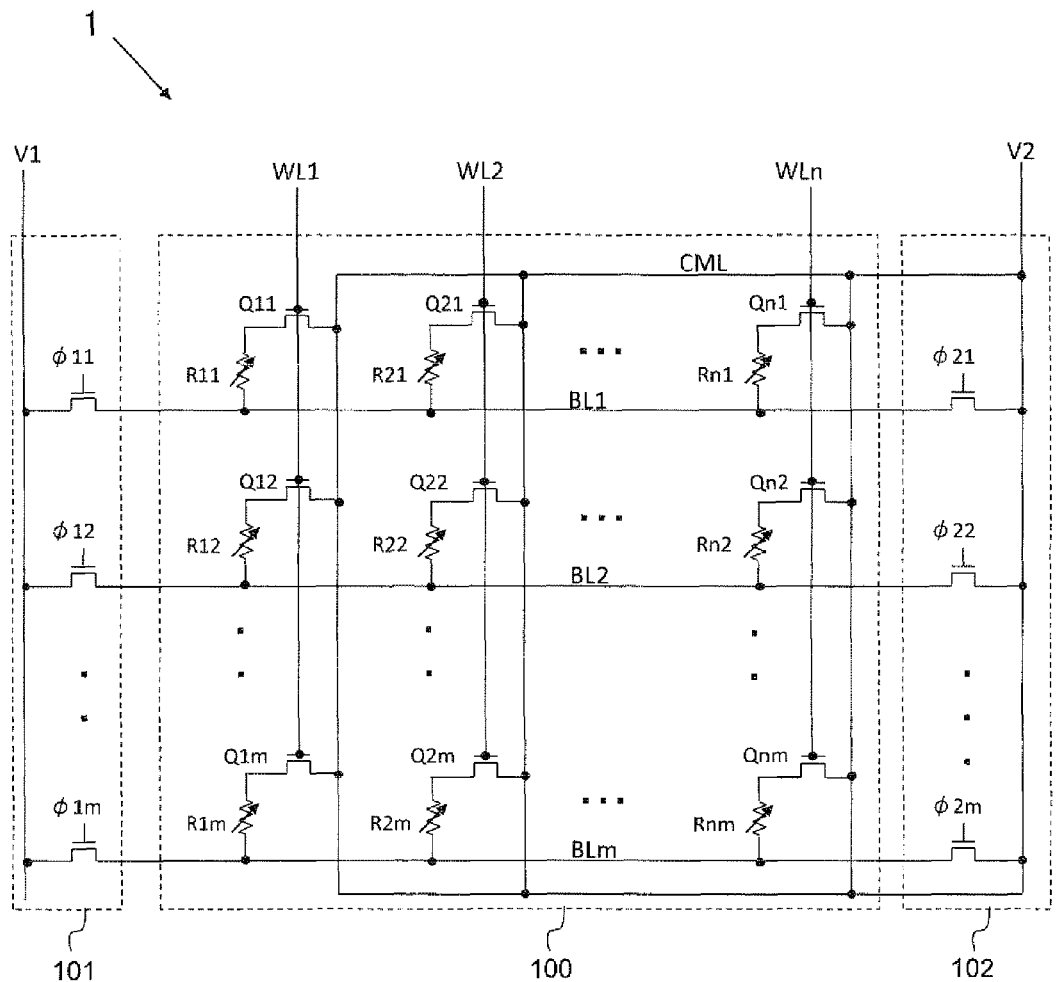
FIG. 1 is a diagram of a circuit configuration of a semiconductor memory device according to the present invention.

FIG. 1 shows a diagram of a circuit configuration of a semiconductor memory device according to an embodiment of the present invention (hereinafter, referred to as a "device 1 of the present invention"). The device 1 of the present invention includes a memory cell array 100, a first voltage applying circuit 101, and a second voltage applying circuit 102, and the memory cell array 100 is configured by R11 to Rn1, R12 to Rn2, . . . , R1$m$ to Rnm as variable resistance elements (memory elements) and Q11 to Qn1, Q12 to Qn2, . . . , Q1$m$ to Qnm as transistors for memory cell selection, arranged respectively in a column direction (a vertical direction in the figure) and a row direction (a lateral direction in the figure) in a matrix. In each of the memory cells, one terminal of a variable resistance element and one terminal of input/output terminals of a transistor are connected, and the other terminals of the variable resistance elements, which do not connect with the transistors, of the memory cells arranged in the same row are respectively connected to bit lines BL1, BL2, . . . , BLm, and the other terminals of the input/output terminals of the transistors, which do not connect with the variable resistance elements, of the memory cells arranged in the same column are connected to a common line CML. Control terminals of the transistors of the memory cells arranged in the same column are respectively connected to word lines WL1 to WLn.

Each of the variable resistance elements R11 to Rnm is an element in which electrodes are supported on both ends of a variable resistor made of a transition metal oxide, or the like, and as a material of the variable resistor, respective oxides of Al, Hf, Ni, Co, Ta, Zr, W, Ti, Cu, V, Zn, and Nb, or oxynitrides, or strontium titanates (SrTiO$_x$) may be used.

Note that, in the case of using these metal oxides as the material of the variable resistor, an initial resistance of the variable resistance element just after production is extremely high; and in order to bring it into a state in which switching between a high resistance state and a low resistance state is possible by an electric stress, it is necessary to perform a so-called forming processing prior to an actual use, in which a voltage pulse having a larger voltage amplitude and a longer pulse width than a voltage pulse used in a normal writing operation is applied to the variable resistance element that is in the initial state just after production to form a current path in which a resistance switching occurs. It is known that an electrical property of the element thereafter is determined by the current path (also called a filament path) formed by this forming processing.

In writing and reading operations of the memory cells in the memory cell array 100, a memory cell that is a target of the operation is selected, a selected word line voltage and a selected bit line voltage are applied respectively to a word line and a bit line connected to the selected memory cell, an unselected bit line voltage is applied respectively to bit lines connected to unselected memory cells, and a precharge voltage is applied to a common line, thereby the writing and reading of information stored in a variable resistance element of the selected memory cell can be performed.

The first voltage applying circuit 101 supplies a write voltage for writing the information stored in the variable resistance element of the selected memory cell to the bit line connected to respective one of the selected memory cells via a write power line V1. The write power line V1 and each of the bit lines are connected via transistors for switching, respectively, and a bit line to which the write voltage is to be applied can be selected by switching signals φ11, φ12, . . . , φ1m.

The second voltage applying circuit 102 supplies the precharge voltage to the bit line and the common line connected to each of the selected memory cells via a precharge power line V2. The precharge power line V2 and each of the bit lines are connected via the transistors for switching, respectively, and a bit line to which the precharge voltage is to be applied can be selected by switching signals φ21, φ22, . . . , φ2m. On the other hand, the precharge power line V2 is directly connected with the common line, and the precharge voltage is directly applied to the common line. Before the write voltage is applied via the write power line V1 of the first voltage applying circuit 101 and the bit lines, the precharge voltage is previously applied from the precharge power line V2 to a bit line connected to the selected or unselected memory cell directly or via the transistor for switching. Accordingly, for all of the unselected memory cells connected to the bit line to which the selected memory cell connects, regardless of whether the memory cells are connected to the selected word line or connected to the unselected word line, both terminals of the transistors and variable resistance elements of the memory cells can be made to have an identical potential.

Further, although not shown, the word line voltage applying circuit supplies a selected word line voltage to the word line connected to the selected memory cell, for each of the selected word lines WL1, WL2, . . . , WLn. The respective word lines and the word line voltage applying circuit are connected via the transistors for switching (not shown) respectively, and the word line to which the selected word line voltage is to be applied can be selected by the switching signals.

Figure 2:
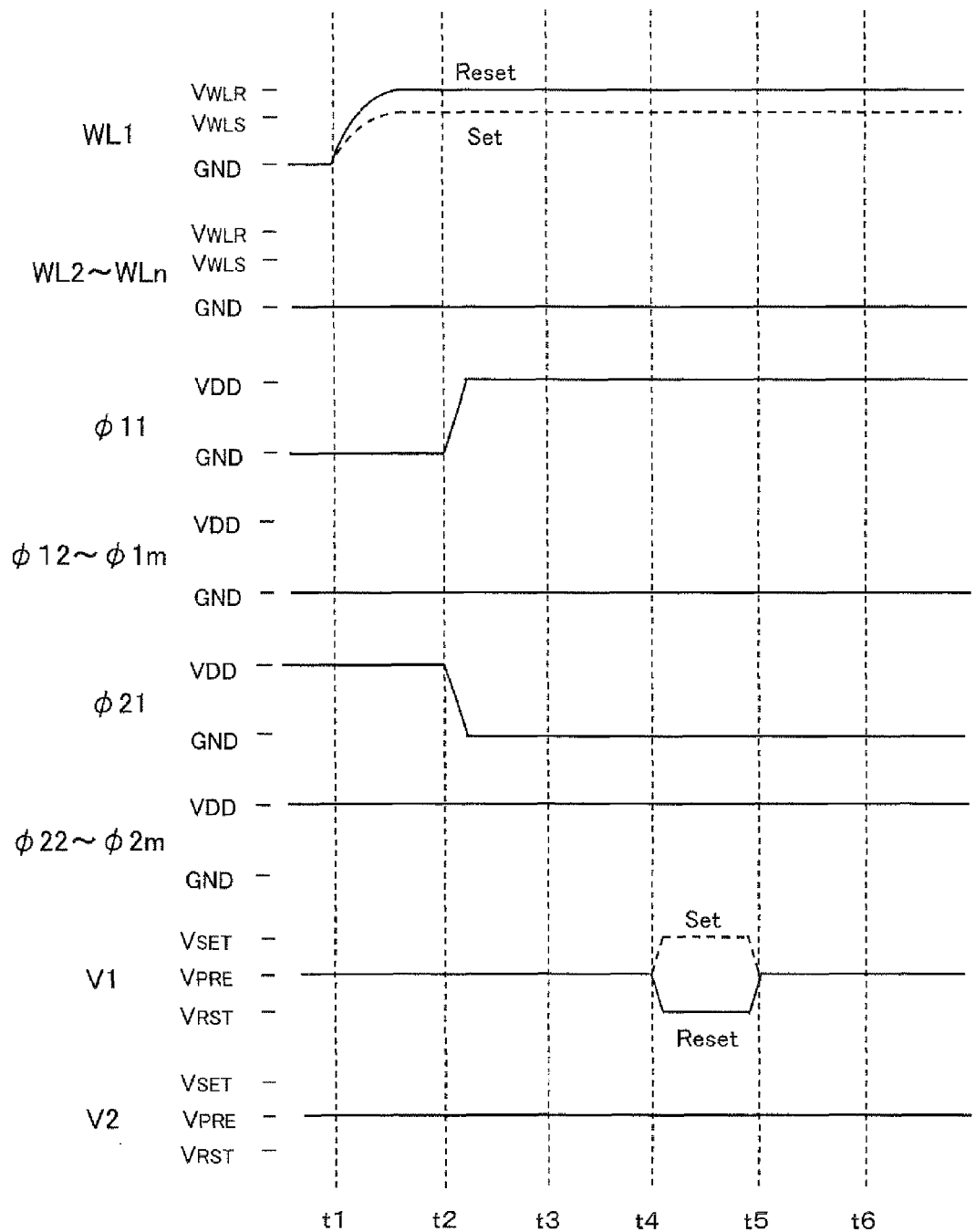
FIG. 2 is a timing chart upon writing in the semiconductor memory device according to the present invention.

FIG. 2 shows a timing chart of the voltage signals for the word lines WL1 to WLn, switching signals φ11 to φ1m, φ21 to φ2m, the write power line V1 and the precharge power line V2 upon the writing in the device 1 of the present invention. Note that FIG. 2 specifically shows a timing chart in the case of performing the writing on the variable resistance element R11 of FIG. 1 as an example.

Firstly, φ21 to φ2m are raised, a precharge voltage $V_{PRE}$ (representative value: 3 V) is applied from the precharge power line V2 to the bit lines and the common line via the switching transistors of the second voltage applying circuit 102, and the voltages of both terminals of all of the memory cells are previously precharged to $V_{PRE}$.

At time t1, the word line WL1 is raised to a voltage $V_{WLS}$ (representative value: 4 V) upon setting the word line WL1, or raised to a voltage $V_{WLR}$ (representative value: 9 V) upon resetting the word line WL1, and then φ21 is lowered at time t2, and the precharging operation on the selected bit line is completed. At the same time, φ11 is raised, and the selected bit line is connected to the write power line V1. At this time, since the precharge voltage $V_{PRE}$ is supplied to the write power line V1, the potential of both terminals of the memory cell maintains the precharge voltage $V_{PRE}$.

Thereafter, during time t4 to t5, the write voltage pulse is applied to the write power line V1. That is, upon the setting, the write power line V1 is changed to a voltage $V_{SET}$ (representative value: 6 V), and a current is made to flow from the selected bit line BL1 to the common line via R11 and Q11. On the other hand, upon the resetting, the write power line V1 is changed to a voltage $V_{RST}$ (representative value: 0 V), and the current is made to flow toward the selected bit line BL1 from the common line via Q11 and R11. At this time, the application of the precharge voltage $V_{PRE}$ via the precharge power line V2 is maintained on the common line.

In the above writing operation, upon the application of the write voltage pulse during t4 to t5 in FIG. 2, the voltage of the common line and the unselected bit lines are not changed either in the setting or in the resetting, and only the selected bit line is driven. Accordingly, as compared to the conventional method of driving both the bit line side and the common line side, since a parasitic resistance and a parasitic capacity become smaller, the time duration of t4 to t5 can be set very short. As a result, a high-speed operation becomes possible.

Note that in the present embodiment, although an identical precharge voltage $V_{PRE}$ is applied for the setting and the resetting, a configuration in which the precharge voltage is made to differ in the setting and the resetting is also possible.

Figure 3:
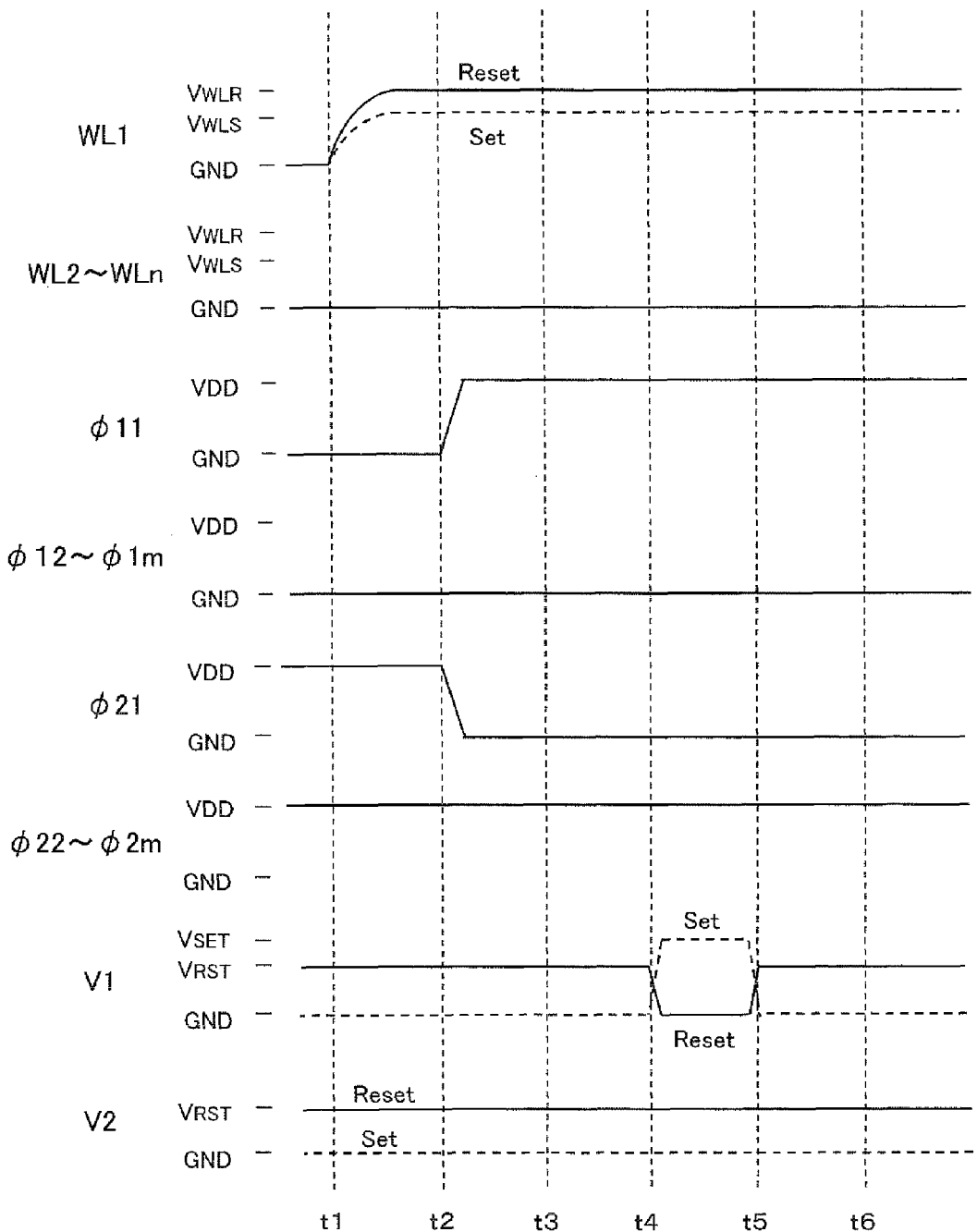
FIG. 3 is a timing chart upon writing in the semiconductor memory device according to the present invention.

As shown in FIG. 3, GND (representative value: 0 V) is applied upon the setting and $V_{RST}$ (representative value: 3 V) is applied upon the resetting via the write power line V1 and the precharge power line V2 on both the common line and the bit lines, and the common line and the bit lines are previously precharged with an identical voltage. After a word line is selected, and the precharging operation is completed, during the time t4 to t5, $V_{SET}$ (representative value: 4 V) is applied upon the setting and GND (representative value: 0 V) is applied upon the resetting to the selected bit line via the write power line V1.

With the above configuration, a circuit design can be made easier since there is no need to prepare a dedicated precharge power source.

Second Embodiment

In the first embodiment, the writing operation in the case of selecting and writing the variable resistance elements of one memory cell of the device 1 of the present invention has been described. Alternatively, variable resistance elements of a plurality of memory cells connected to the same word line can be selected, and the setting or resetting operation can be performed simultaneously and collectively at a high speed.

Figure 4:
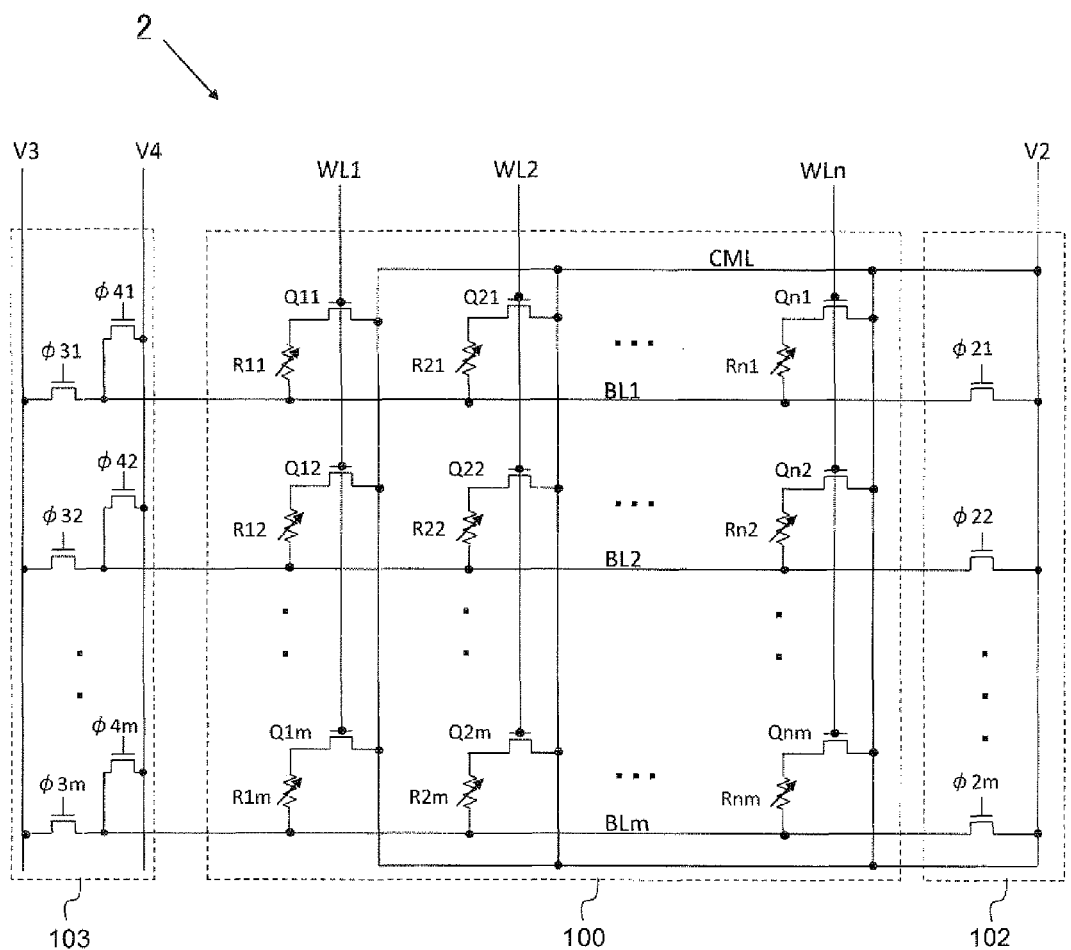
FIG. 4 is a diagram showing another example of the circuit configuration of the semiconductor memory device according to the present invention.

Further, by having a plurality of write power lines, the setting operation and the resetting operation can respectively be performed for a plurality of variable resistance elements connected to the same word line and different bit lines. FIG. 4 shows a diagram of a circuit configuration of a semiconductor memory device according to an embodiment of the present invention (hereinafter, referred to as a "device 2 of the present invention"). In the device 2 of the present invention, a first voltage applying circuit 103 includes two write power lines, a first write power line V3 and a second write power line V4, and supplies a write voltage to bit lines connected to each of the selected memory cells via the first write power line V3 or the second write power line V4. As for the configurations of the memory cell array 100 and the second voltage applying circuit 102, descriptions thereof will be omitted since they have the same configuration as in the device 1 of the present invention shown in FIG. 1. As for the configuration of the word line applying circuit (not shown) also, the description thereof will be omitted for being the same as in the device 1 of the present invention.

The first write power line V3 and each of the bit lines are respectively connected via the transistors for switching, and a bit line to which the write voltage is to be applied can be selected by switching signals φ31, φ32, ..., φ3m. Similarly, the second write power line V4 and each of the bit lines are respectively connected via the transistors for switching, and a bit line to which the write voltage is to be applied can be selected by switching signals φ41, φ42, ..., φ4m. A voltage applied to the first write power line V3 and a voltage applied to the second write power line V4 are different, and due to this, for the plurality of variable resistance elements connected to different bit lines, one of the voltage applied to the first write power line V3 and the voltage applied to the second write power line V4 can simultaneously be applied by selecting based on the switching signals φ31 to φ3m and φ41 to φ4m.

Figure 5:
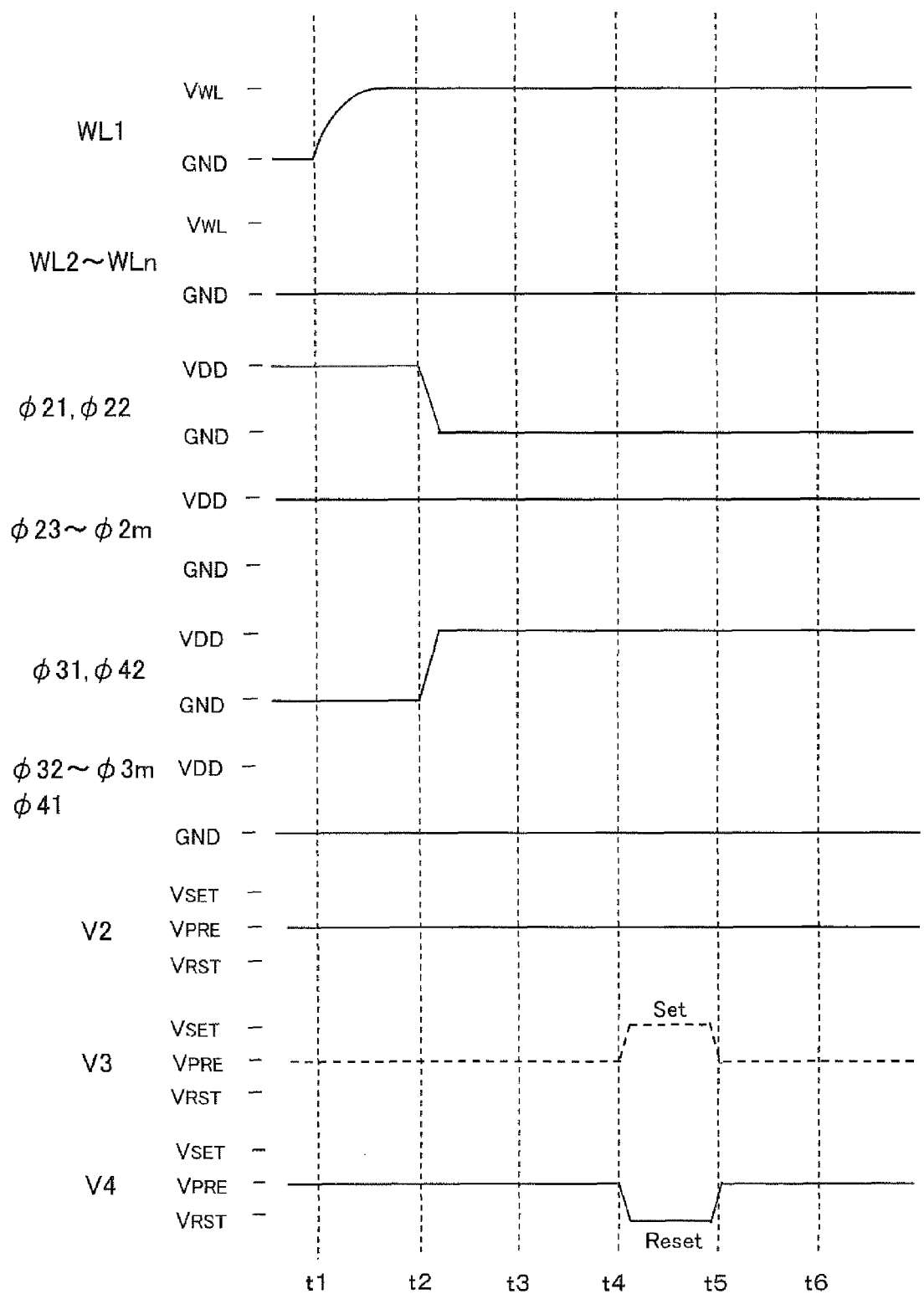
FIG. 5 is a timing chart upon the writing in the semiconductor memory device according to the present invention.

FIG. 5 shows a timing chart of the voltage signals for the word lines WL1 to WLn, the switching signals φ21 to φ2m, φ31 to φ3m, φ41 to φ4m, the precharge power line V2, the first write power line V3, and the second write power line V4 upon the writing in the device 2 of the present invention. Different from the first embodiment in which the selected word line voltage differs in the setting operation and the resetting operation, an identical word line voltage $V_{WL}$ can be used for the setting operation and the resetting operation. Accordingly, for the plurality of variable resistance elements connected to the same word line and the different bit lines, the setting operation and the resetting operation can independently be performed. Here, an example of the case in which R11 is set and R12 is reset will be described.

First, φ21 to φ2m are raised, the precharge voltage $V_{PRE}$ (representative value: 3 V) is applied from the precharge power line V2 to the bit lines and the common line via the switching transistors of the second voltage applying circuit 102, and voltages of both terminals of all of the memory cells are previously precharged to $V_{PRE}$.

After the word line WL1 is raised to the voltage $V_{WL}$ (representative value: 6 V) at time t1, φ21, φ22 are lowered at time t2, and the precharging operation on the selected bit lines is completed. At the same time, φ31 is raised, and the selected bit line BL1 is connected to the first write power line V3, and further, φ42 is raised, and the selected bit line BL2 is connected to the second write power line V4. At this time, since the precharge voltage $V_{PRE}$ is supplied to the write power lines V3 and V4, the potential of both terminals of the memory cells maintains the precharge voltage $V_{PRE}$. On the other hand, the switching transistors φ33 to φ3m, φ43 to φ4m connected to unselected bit lines are turned off so that the write voltage pulse from the first voltage applying circuit 103 is not applied to the bit lines connected to the unselected memory cells that are not the writing target.

Thereafter, during time t4 to t5, the write voltage pulse is applied to the write power lines V3 and V4. That is, the setting operation of the variable resistance element R11 is performed by changing the first write power line V3 for the setting operation to a voltage $V_{SET}$ (representative value: 6 V), and causing a current to flow from the selected bit line BL1 to the common line via R11 and Q11. On the other hand, the resetting operation of the variable resistance element R12 is performed by changing the second write power line V4 for the resetting operation to a voltage $V_{RST}$ (representative value: 0 V), and causing the current to flow toward the selected bit line BL2 from the common line via Q12 and R12. At this time, the application of the precharge voltage $V_{PRE}$ via the precharge power line V2 is maintained on the common line.

In the above embodiment, since the precharge voltage is set to be an intermediate voltage between the write voltage applied to the first write power line V3 and the write voltage applied to the second write power line V4, the polarity of the write voltage applied to the bit line with the precharge voltage as a reference voltage can be made to differ in the case of the write voltage being supplied from the first write power line V3 and in the case of the write voltage being supplied from the second write power line V4, and the polarity of the write voltage pulse applied to the selected variable resistance elements of memory cells can be inverted in the case of the write voltage being supplied from the first write power line and the case of the write voltage being supplied from the second write power line. Accordingly, a high-speed operation is possible, and a semiconductor memory device suitable for a bipolar variable resistance element can be realized.

Third Embodiment

Next, a voltage applying condition for performing the writing of the variable resistance elements will be described. A voltage applied to the selected word lines is applied to gates of the transistors of the selected memory cells. Here, it is assumed that $V_{WLS}$ is applied upon the setting (lowering the resistance) and $V_{WLR}$ is applied upon the resetting (increasing the resistance) to the selected word lines. Upon the setting and the resetting, an amount of current flowing in each of the memory cells is the same as an amount of current flowing in the corresponding transistor, and is defined by an absolute value of a potential difference Vgs between a gate and a source of the transistor.

In the writing of variable resistance elements using transition metal oxide as the variable resistor, in the setting (lowering the resistance) operation, it is preferable to have a large potential difference (an absolute value of a difference of the write voltage and the precharge voltage) applied to both terminals of the memory cell, because the lowering of the resistance can be performed stably by applying sufficient electric field. However, Vgs needs to be small due to the restriction on the amount of current with respect to the large write voltage.

On the other hand, in the resetting (increasing the resistance) operation, it is necessary to have a small potential difference (the absolute value of the difference of the write voltage and the precharge voltage) applied to both terminals of the memory cell, because an excessive application of the electric field causes the lowering of the resistance, however, Vgs needs to be as large as possible because the resetting operation itself is generated by the current.

As described above, since making the Vgs large in the resetting operation and making the Vgs small in the setting operation are the condition of stable programming, it has been difficult to perform the writing while fixing the voltage of the selected word lines upon the setting and the resetting.

However, as shown in the first and second embodiments, by setting the precharge voltage to be the intermediate voltage between the set voltage and the reset voltage, the Vgs in the resetting operation becomes larger than the Vgs in the setting operation in the writing of bipolar variable resistance elements, and the condition can be satisfied.

Accordingly, by employing the precharging configuration of the present invention, it becomes easy to perform the writing while fixing the voltage of the selected word lines upon the setting and the resetting; and further, by applying an identical precharge voltage upon setting and the resetting, variable resistance elements of a plurality of memory cells connected to the same word line can be selected simultaneously and collectively or in consecutive order, and the setting or the resetting operation can be performed at a high speed.

In the memory cell of the device 1 or 2 of the present invention, a source voltage is defined by a lower one of the write voltage applied to the bit lines and the precharge voltage applied to the common line, and a drain voltage is defined by a higher one thereof. Further, Vgs is controlled with the voltages $V_{WLS}$ and $V_{WLR}$ of the selected word lines as the parameters, and the amount of current upon the setting and the resetting is controlled. More specifically, in the configuration of FIG. 2 or FIG. 5, when the voltage applied to the variable resistance elements upon the resetting operation is ignored, upon the setting: $Vgs=V_{WLS}-V_{PRE}$ upon the resetting: $Vgs=V_{WLR}-V_{RST}$ determine the amount of current flowing in the variable resistance elements. Here, $V_{RST}<V_{PRE}$. Accordingly, in the precharging configuration of the present invention, as the voltage settings, it is preferable to have $V_{WLR}-V_{RST}$ to be as large as possible, and $V_{WLS}-V_{PRE}$ to be as small as possible. As an example of the condition under which a bipolar operation is actually possible in this configuration, in the present embodiment, e.g., $V_{PRE}=2.0V$, $V_{WL}(=V_{WLS}=V_{WLR})=4.0V$, $V_{SET}=5.0V$, $V_{RST}=0V$ are applied to both terminals of the memory cells selected as the writing target.

Figure 7:
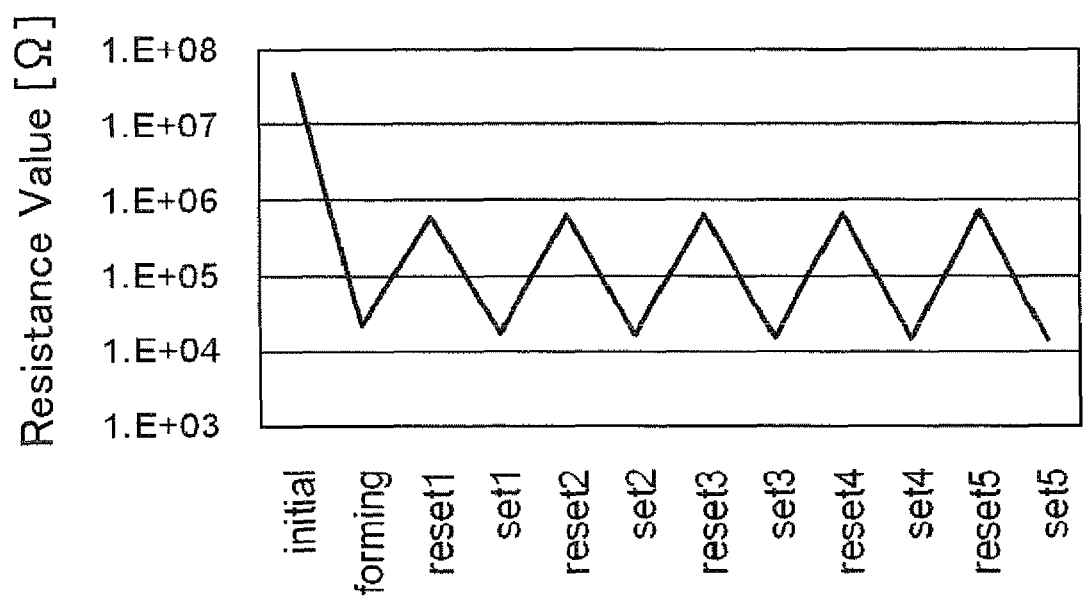
FIG. 7 is a diagram showing writing operation characteristics of the semiconductor memory device according to the present invention.
Figure 8:
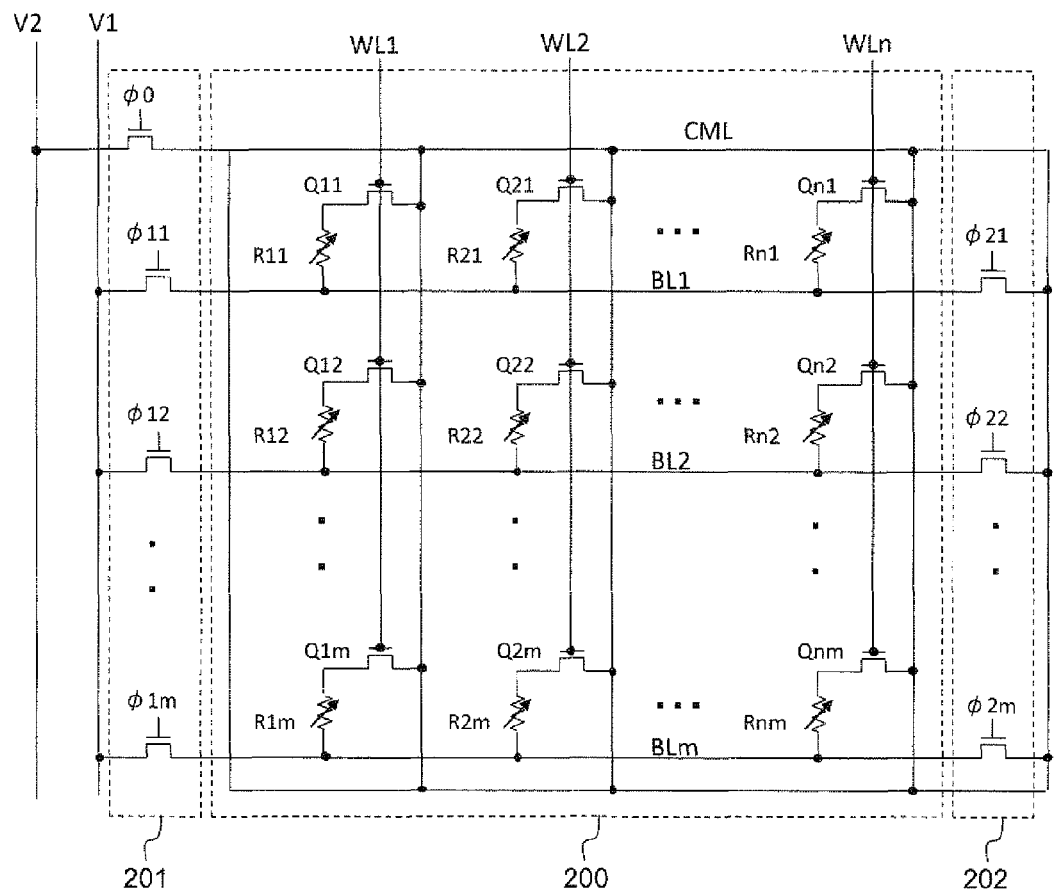
FIG. 8 is a diagram of a circuit configuration of a conventional semiconductor memory device.
Figure 9:
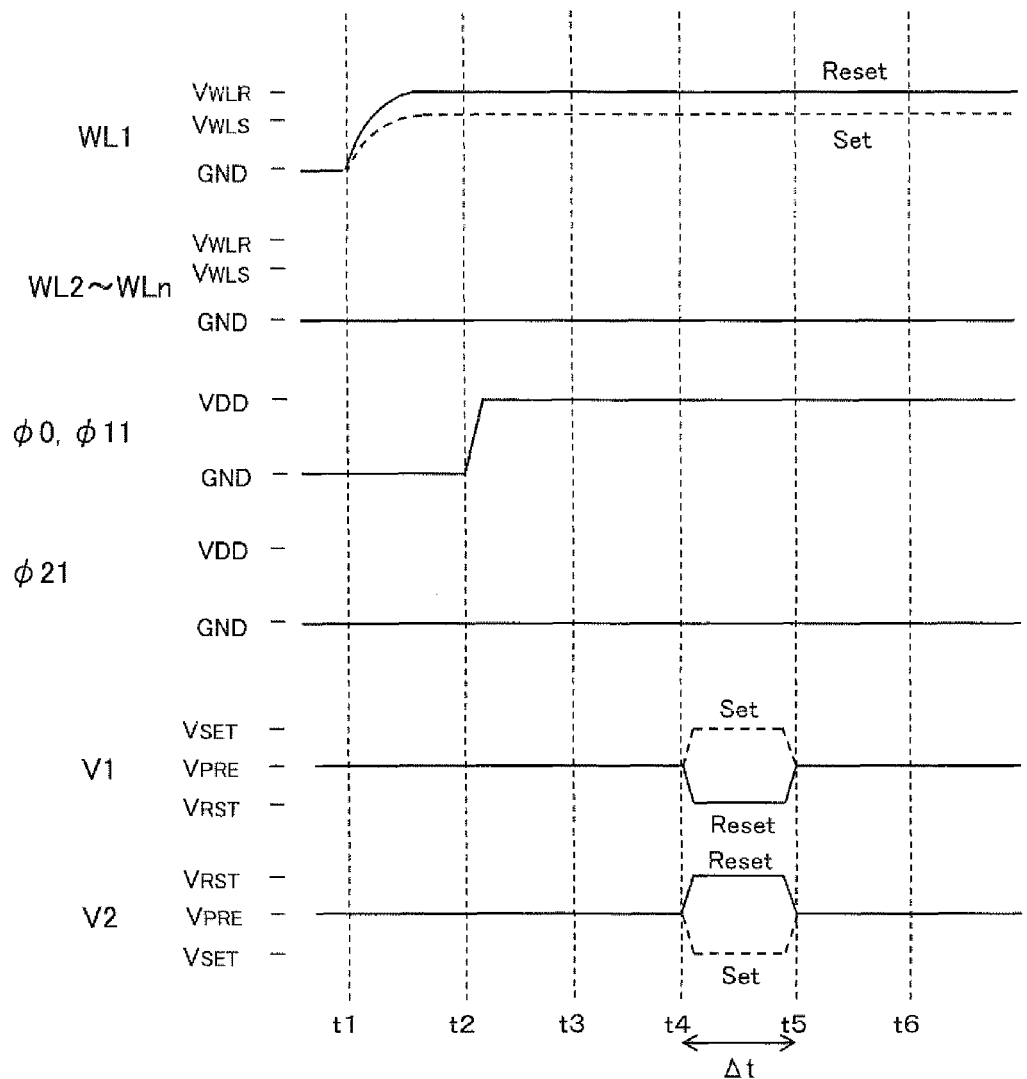
FIG. 9 is a timing chart upon writing in the conventional semiconductor memory device.
Figure 10:
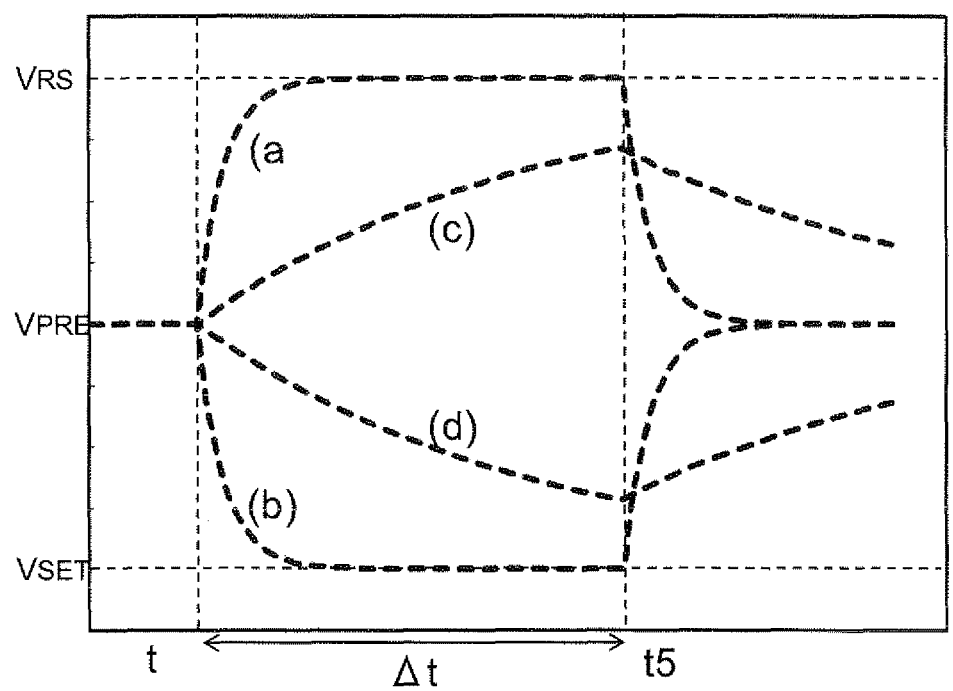
FIG. 10 is a diagram showing a chronological change of a voltage applied to one terminal of a memory element in a case where a write voltage pulse is applied from a common line in the conventional semiconductor memory device.

FIG. 7 shows a change of a resistance value (intermediate value) upon the writing operation of a 256 bit element under the above voltage condition. Here, "initial" indicates an initial resistance value just after production, "forming" indicates a resistance value just after the forming processing, "reset 1 to 5" indicate resistance values in a high resistance state after the resetting operation, and "set 1 to 5" indicate resistance values in a low resistance state after the setting operation, respectively. As can be seen from FIG. 7, a stable writing of the variable resistance elements can be realized by employing the circuit configuration of the present invention.

Other Embodiments

Hereinafter, other embodiments will be described.

(1) In the above embodiments, descriptions have been made of the example in which the common line extends in the column direction (the vertical direction in FIG. 1 and FIG. 4) and is arranged vertical to the bit lines, however, the present invention is not limited thereto, and the common line may extend in the row direction parallel to the bit lines. In the present invention, since the voltage on the common line side is not changed upon the writing, there is no difference in the application of the present invention with regard to the extending direction of the common line.

(2) Further, in the above embodiments, in the memory cells each formed by connecting one terminal of a variable resistance element and one terminal of input/output terminals of a transistor, the memory cell array 100 is configured by connecting the other terminal of each of the variable resistance elements of the memory cells, which is not connected to the transistor, to the bit line, and connecting the other terminal of the input/output terminals of the transistors of each of the memory cells, which is not connected to the variable resistance element, to the common line. However, it is apparent that the present invention can be applied to an opposite case, that is, to a memory cell array 100 in which the other terminal of the input/output terminals of the transistors of each of the memory cells, which is not connected to the variable resistance element, is connected to the bit line, and the other terminal of each of the variable resistance elements of the memory cells, which is not connected to the transistor, is connected to the common line.

Figure 6:
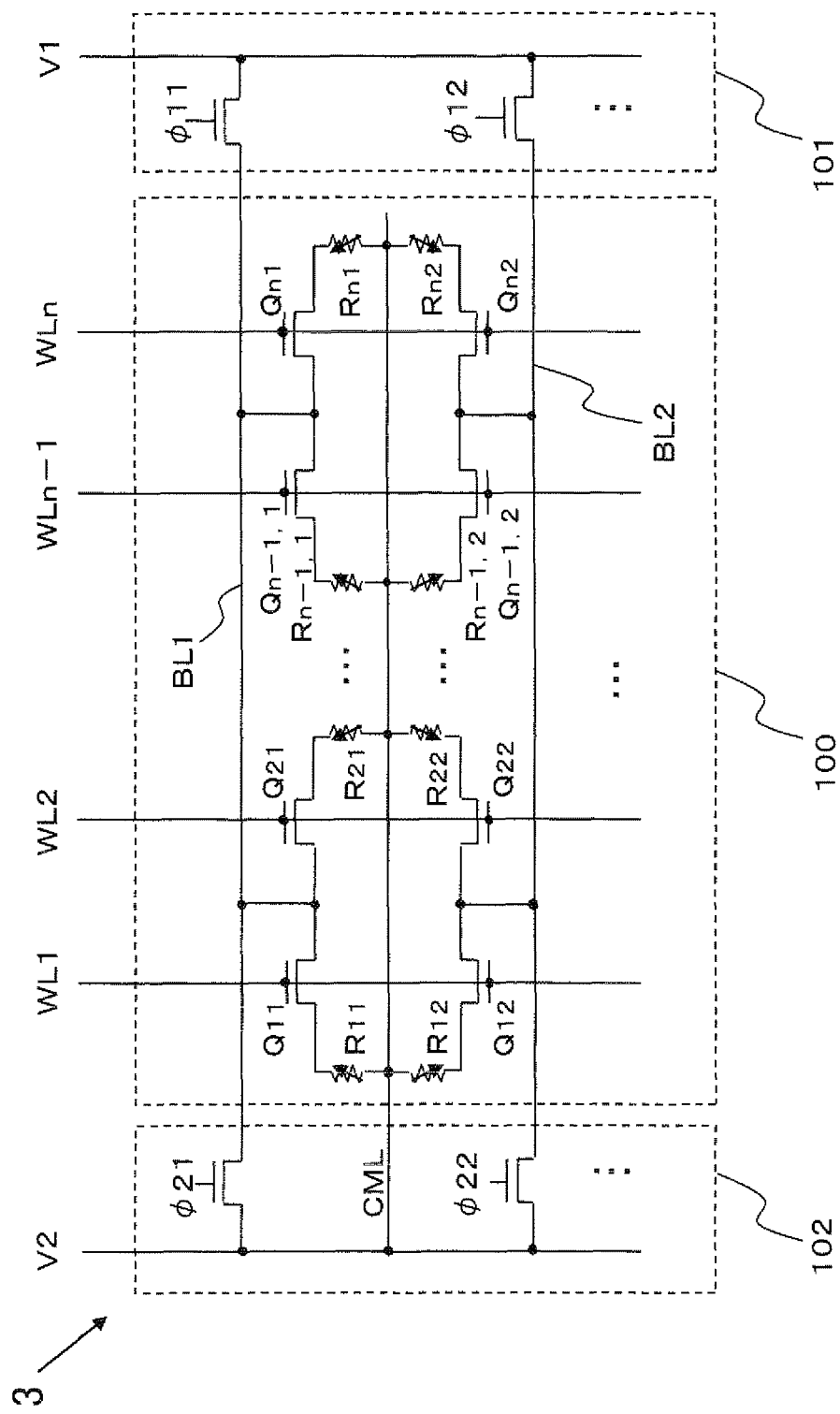
FIG. 6 is a diagram showing another example of the circuit configuration of the semiconductor memory device according to the present invention.

FIG. 6 shows a diagram of a circuit configuration of a semiconductor memory device according to an embodiment of the present invention (hereinafter, referred to as a "device 3 of the present invention"). In FIG. 6, the bit lines BL1, BL2 and the common line CML all extend in the row direction (lateral direction in FIG. 6). Further, in the memory cell array 100, the other terminal of the input/output terminals of a transistor of a memory cell, which is not connected to a variable resistance element, is connected to the bit line, and the other end of the variable resistance element of the memory cell, which is not connected to the transistor, is connected to the common line. Further, it has a configuration in which the other terminals of variable resistance elements R11 to Rn1 and R12 to Rn2 arranged in the row direction are respectively connected to a mutual common line, whereby one common line is shared by every two adjacent rows of memory cells in the column direction (vertical direction in FIG. 6).

As for the device 3 of the present invention as well, a semiconductor memory device capable of a high-speed operation can be realized by performing the writing in the method shown in FIG. 2 and FIG. 3.

Further, the device 3 of the present invention may have a configuration of employing the first voltage applying circuit 103 of FIG. 4 instead of the first voltage applying circuit 101, and having a plurality of write power lines.

(3) In the above embodiments, although the common line is directly connected to the precharge power line V2 of the second voltage applying circuit without interposing the transistors for switching, the transistors for switching may be respectively interposed between the common line and the precharge power line, and the common line and the precharge power line may be connected via the transistors. By using all of the transistors in the ON state, the writing operation can be performed at a high speed similar to the above embodiments. Further, by employing a configuration in which the common line to which the precharge voltage is to be applied can be selected based on a switching signal, the memory cells to which the precharging operation is to be performed can be selected. In this case, in the writing operation of the selected memory cells, the precharge voltage only needs to be applied via the transistors for switching to the common line connected to the selected memory cells and the bit lines to which the memory cells connected to the common line are connected, and as for other unselected memory cells that are not connected to the common line of the selected memory cell, the transistors for switching may be turned off so that voltages from the write power line V1 and the precharge power line V2 are not applied from both of the bit lines and the common line to which the unselected memory cells are connected. Due to this, by selecting only the memory cells that needs the precharging operation and applying the precharge voltage thereto, power consumption of the driving circuit supplying the precharge voltage can be reduced.

(4) In the above embodiments, although pulse voltages for writing are applied from the write power line V1, or V3 and V4, the write voltage pulses may be supplied to the selected bit lines by supplying a constant write voltage to the write power line, and providing pulse signals to the transistors for switching that are connected to the selected bit lines. Specifically, for example, in the writing timing diagram shown in FIG. 2, by constantly supplying a constant voltage $V_{SET}$ or the reset voltage $V_{RST}$ to the write power line V1, and raising φ11 only during the time t4 to t5 to turn on the transistor for switching, the write voltage pulse for resetting is applied to the bit line BL1.

(5) Further, in the first and second embodiments, although the bipolar variable resistance element is used as the memory element, it is apparent that the present invention can also be applied to a unipolar variable resistance element that performs writing using a write voltage pulse with a single polarity.

(6) Further, in the above embodiments, although writing of binary data as the memory cell is the target, the present invention can also be applied to writing of multilevel data having three or more levels by adjusting the write voltage corresponding to the respective data.

The present invention can be used in a semiconductor memory device, and particularly, the present invention can be used in a non-volatile memory installed in electronic equipment in which a high-speed operation is required.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
a memory cell array formed of a plurality of memory cells being arranged in column and row directions in a matrix, each of the plurality of memory cells including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor;
word lines extending in the column direction and respectively connecting the control terminals of the cell transistors of the memory cells arranged in the same column;
bit lines extending in the row direction and connecting the other terminals of the input/output terminals, which do not connect with the cell transistors, of the memory elements of the memory cells arranged in the same row;
a common line extending in the column or the row direction, and connecting the other terminals of the input/output terminals, which do not connect with the memory elements, of the cell transistors of the memory cells;
a word line voltage applying circuit that applies a voltage to a word line connected to the memory cell selected as a writing target in the writing of the information stored in the memory element;
a first voltage applying circuit that applies a write voltage to the bit line connected to the selected memory cell; and
a second voltage applying circuit that previously applies an identical precharge voltage to both of the bit line and the common line connected to the selected memory cell prior to applying the write voltage, and that applies the precharge voltage to the common line connected to the selected memory cell while the write voltage is applied to the bit line connected to the selected memory cell.

2. The semiconductor memory device according to claim 1, wherein
the second voltage applying circuit includes a precharge power line to which the precharge voltage is applied, and the precharge power line is directly connected to the common line, and is connected to the respective bit lines via first transistors that are provided for each of the bit lines.

3. The semiconductor memory device according to claim 1, wherein
the first voltage applying circuit includes a write power line to which the write voltage is applied, and
the write power line is connected to the respective bit lines via second transistors that are provided for each of the bit lines.

4. The semiconductor memory device according to claim 1, wherein
the first voltage applying circuit includes a first write power line and a second write power line to which the write voltage having a different application voltage from the precharge voltage is respectively applied.

5. The semiconductor memory device according to claim 1, wherein
in the writing of the information stored in the memory element,
a first writing operation of writing the electrical property of the memory element from a first state to a second state, and a second writing operation of writing the electrical property of the memory element from the second state to the first state are included, and
the precharge voltage applied by the second voltage applying circuit in the first writing operation is identical to that in the second writing operation.

6. The semiconductor memory device according to claim 1, wherein
in the writing of the information stored in the memory element,
a first writing operation of writing the electrical property of the memory element from a first state to a second state, and a second writing operation of writing the electrical property of the memory element from the second state to the first state are included, and
the precharge voltage applied by the second voltage applying circuit in the first writing operation is different from that in the second writing operation.

7. The semiconductor memory device according to claim 1, wherein
in the writing of the information stored in the memory element,
a first writing operation of writing the electrical property of the memory element from a first state to a second state having a lower resistance than the first state, and a second writing operation of writing the electrical property of the memory element from the second state to the first state are included,
a polarity of the write voltage with respect to the precharge voltage in the first writing operation is different from that in the second writing operation, and
a voltage difference between a word line voltage applied to the word line connected to the selected memory cell and a lower one of the precharge voltage and the write voltage in the first writing operation is smaller than a voltage difference between the word line voltage and a lower one of the precharge voltage and the write voltage in the second writing operation.

8. The semiconductor memory device according to claim 7, wherein
the word line voltage applied by the word line voltage applying circuit in the first writing operation is identical to that in the second writing operation.

9. The semiconductor memory device according to claim 8, wherein in the writing of the information stored in the plurality of memory elements, a plurality of the memory cells connected to the selected word line are selected, and the first writing operation or the second writing operation is performed consecutively on the plurality of memory cells.

10. The semiconductor memory device according to claim 7, wherein the precharge voltage applied by the second voltage applying circuit in the first writing operation is identical to that in the second writing operation.

11. The semiconductor memory device according to claim 1, wherein the memory element is a bipolar variable resistance element in which a resistance state expressed by a resistance property between the two input/output terminals of the memory element reversibly transitions by applying voltages having different polarities.

12. A semiconductor memory device comprising:

a memory cell array formed of a plurality of memory cells being arranged in column and row directions in a matrix, each of the plurality of memory cells including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor;

word lines extending in the column direction and respectively connecting the control terminals of the cell transistors of the memory cells arranged in the same column;

bit lines extending in the row direction and connecting the other terminals of the input/output terminals, which do not connect with the memory elements, of the cell transistors of the memory cells arranged in the same row;

a common line extending in the column or row direction and connecting the other terminals of the input/output terminals, which do not connect with the cell transistors, of the memory elements of the memory cells;

a word line voltage applying circuit that applies a voltage to a word line connected to the memory cell selected as a writing target in the writing of the information stored in the memory element;

a first voltage applying circuit that applies a write voltage to the bit line connected to the selected memory cell; and a second voltage applying circuit that previously applies an identical precharge voltage to both of the bit line and the common line connected to the selected memory cell prior to application of the write voltage, and that applies the precharge voltage to the common line connected to the selected memory cell while the write voltage is applied to the bit line connected to the selected memory cell, wherein in the writing of the information stored in the memory element, a first writing operation of writing the electrical property of the memory element from a first state to a second state, and a second writing operation of writing the electrical property of the memory element from the second state to the first state are included, and the precharge voltage applied by the second voltage applying circuit in the first writing operation is different from that in the second writing operation.

13. The semiconductor memory device according to claim 12, wherein the second voltage applying circuit includes a precharge power line to which the precharge voltage is applied, and the precharge power line is directly connected to the common line, and is connected to the respective bit lines via first transistors that are provided for each of the bit lines.

14. The semiconductor memory device according to claim 12, wherein the memory element is a bipolar variable resistance element in which a resistance state expressed by a resistance property between the two input/output terminals of the memory element reversibly transitions by applying voltages having different polarities.

15. A method of driving a semiconductor memory device, the semiconductor memory device including:

a memory cell array formed of a plurality of memory cells being arranged in column and row directions in a matrix, each of the plurality of memory cells including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor;

word lines extending in the column direction and respectively connecting the control terminals of the cell transistors of the memory cells arranged in the same column;

bit lines extending in the row direction and connecting the other terminals of the input/output terminals, which do not connect with the cell transistors, of the memory elements of the memory cells arranged in the same row; and a common line extending in the column or the row direction, and connecting the other terminals of the input/output terminals, which do not connect with the memory elements, of the cell transistors of the memory cells, the method comprising:

in the writing of the information stored in the memory element, a word line voltage applying step of selecting the memory cell that is a writing target and applying a word line voltage to the word line connected to the selected memory cell;

a precharging step of previously applying an identical precharge voltage to both of the bit line and the common line connected to the selected memory cell prior to application of a write voltage; and a writing step of applying the write voltage to the bit line connected to the selected memory cell and maintaining the application of the precharge voltage to the common line connected to the selected memory cell during the application of the write voltage.

16. The method of driving a semiconductor memory device according to claim 15, wherein the semiconductor memory device includes a first voltage applying circuit for applying the write voltage to the bit line connected to the selected memory cell and a second voltage applying circuit for applying the precharge voltage to the bit line and the common line connected to the selected memory cell, the second voltage applying circuit includes a precharge power line that is directly connected to the common line, and is connected to the respective bit lines via first transistors that are provided for each of the bit lines, in the precharging step, the precharge voltage is applied to both of the bit line and the common line via the precharge power line by making the first transistor connected to the bit line connected to the selected memory cell be in an ON state, and in the writing step, the precharge voltage is applied to the common line via the precharge power line by making the first transistor connected to the bit line connected to the selected memory cell be in an OFF state.

17. The method of driving a semiconductor memory device according to claim 15, wherein in the writing of the information stored in the memory element, the precharge voltage applied in the precharging step and the writing step in a case of writing the electrical property of the memory element from a first state to a second state is identical to that in a case of writing the electrical property of the memory element from the second state to the first state.

18. The method of driving a semiconductor memory device according to claim 15, wherein in the writing of the information stored in the memory element, the precharge voltage applied in the precharging step and the writing step in a case of writing the electrical property of the memory element from a first state to a second state is different from that in a case of writing the electrical property of the memory element from the second state to the first state.

19. The method of driving a semiconductor memory device according to claim 15, wherein in the writing step, one of a resistance lowering step of writing the electrical property of the memory element from a first state to a second state having a lower resistance than the first state and a resistance increasing step of writing the electrical property of the memory element from the second state to the first state is performed to each of the memory cells selected as the writing target, a polarity of the write voltage with respect to the precharge voltage in the resistance lowering step is different from that in the resistance increasing step, and a voltage difference between the word line voltage and a lower one of the precharge voltage and the write voltage in the resistance lowering step is smaller than a voltage difference between the word line voltage and a lower one of the precharge voltage and the write voltage in the resistance increasing step.

20. The method of driving a semiconductor memory device according to claim 19, wherein the word line voltage applied in the word line voltage applying step in a case of performing the resistance lowering step is identical to that in a case of performing the resistance increasing step.

21. The method of driving a semiconductor memory device according to claim 20, wherein in the word line voltage applying step, a plurality of the memory cells connected to the selected word line are selected, and the method further including a step of performing the resistance lowering step or the resistance increasing step consecutively on the plurality of memory cells.

22. The method of driving a semiconductor memory device according to claim 19, wherein the precharge voltage applied in the precharging step and the writing step in a case of performing the resistance lowering step is identical to that in a case of performing the resistance increasing step.

23. The method of driving a semiconductor memory device according to claim 15, wherein the memory element is a bipolar variable resistance element in which a resistance state expressed by a resistance property between the two input/output terminals of the memory element reversibly transitions by applying voltages having different polarities.

24. A method of driving a semiconductor memory device, the semiconductor memory device including:

a memory cell array formed of a plurality of memory cells being arranged in column and row directions in a matrix, each of the plurality of memory cells including a memory element and a cell transistor, the memory element having two input/output terminals and storing information by a difference in an electrical property between the two terminals, in which the stored information is written by applying a voltage between the two terminals, the cell transistor having two input/output terminals and one control terminal, one terminal of the input/output terminals of the memory element being connected to one terminal of the input/output terminals of the cell transistor;

word lines extending in the column direction and respectively connecting the control terminals of the cell transistors of the memory cells arranged in the same column;

bit lines extending in the row direction and connecting the other terminals of the input/output terminals, which do not connect with the memory elements, of the cell transistors of the memory cells arranged in the same row; and a common line extending in the column or the row direction and connecting the other terminals of the input/output terminals, which do not connect with the cell transistors, of the memory elements of the memory cells, the method comprising:

in the writing of the information stored in the memory element, a word line voltage applying step of selecting the memory cell that is a writing target and applying a word line voltage to the word line connected to the selected memory cell;

a precharging step of previously applying an identical precharge voltage to both of the bit line and the common line connected to the selected memory cell prior to application of a write voltage; and a writing step of applying the write voltage to the bit line connected to the selected memory cell and maintaining the application of the precharge voltage to the common line connected to the selected memory cell during the application of the write voltage, wherein the precharge voltage applied in the precharging step and the writing step in a case of writing the electrical property of the memory element from a first state to a second state is different from that in a case of writing the electrical property of the memory element from the second state to the first state.

25. The method of driving a semiconductor memory device according to claim 24, wherein the semiconductor memory device includes a first voltage applying circuit for applying the write voltage to the bit line connected to the selected memory cell and a second voltage applying circuit for applying the precharge voltage to the bit line and the common line connected to the selected memory cell, the second voltage applying circuit includes a precharge power line that is directly connected to the common line, and is connected to the respective hit lines via first transistors that are provided for each of the bit lines, in the precharging step, the precharge voltage is applied to both of the bit line and the common line via the precharge power line by making the first transistor connected to the bit line connected to the selected memory cell be in an ON state, and in the writing step, the precharge voltage is applied to the common line via the precharge power line by making the first transistor connected to the bit line connected to the selected memory cell be in an OFF state.

26. The method of driving a semiconductor memory device according to claim 24, wherein the memory element is a bipolar variable resistance element in which a resistance state expressed by a resistance property between the two input/output terminals of the memory element reversibly transitions by applying voltages having different polarities.

* * * * *